(12) United States Patent
Vincent et al.

(10) Patent No.: US 12,288,766 B2
(45) Date of Patent: Apr. 29, 2025

(54) SEMICONDUCTOR DEVICE WITH OPEN CAVITY AND METHOD THEREFOR

(71) Applicant: NXP USA, INC., Austin, TX (US)

(72) Inventors: Michael B. Vincent, Chandler, AZ (US); Scott M. Hayes, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 397 days.

(21) Appl. No.: 17/652,188

(22) Filed: Feb. 23, 2022

(65) Prior Publication Data

US 2023/0268304 A1    Aug. 24, 2023

(51) Int. Cl.
*H01L 23/498* (2006.01)
*H01L 23/00* (2006.01)
(Continued)

(52) U.S. Cl.
CPC .......... *H01L 24/19* (2013.01); *H01L 23/3185* (2013.01); *H01L 23/49816* (2013.01);
(Continued)

(58) Field of Classification Search
CPC ....... H01L 23/00; H01L 23/31; H01L 23/498; H01L 23/538; H01L 23/5386; H01L 23/3185; H01L 23/49816; H01L 23/3128; H01L 23/5389; H01L 25/00; H01L 25/03; H01L 25/16; H01L 25/50; H01L 25/065; H01L 25/0655; H01L 24/20; H01L 24/08; H01L 24/16; H01L 24/19; H01L 24/32; H01L 24/48; H01L 21/48; H01L 21/56; H01L 21/568; H01L 21/683; H01L 21/4853; H01L 21/6835; H01L 21/78; H01L 21/304; H01L 21/561; H01L 21/565; H01L 21/4867; H01L 23/66; H01L 23/315; H01L 23/552; H01L 23/3114; H01L 23/49838; H01L 2221/68372; H01L 2224/19; H01L 2224/16227; H01L 2224/211; H01L 2224/08225;
(Continued)

(56) References Cited

U.S. PATENT DOCUMENTS 8,335,084 B2    12/2012    Lee et al.
8,574,967 B2    11/2013    Gerber et al.
(Continued)

OTHER PUBLICATIONS

Final office action dated Apr. 18, 2024 in U.S. Appl. No. 17/643,198.
(Continued)

*Primary Examiner* — Chuong A Luu

(57) ABSTRACT

A method of forming a semiconductor device is provided. The method includes placing a semiconductor die on a carrier substrate and placing a sacrificial blank on the carrier substrate with a routing structure attached to the sacrificial blank. At least a portion of the semiconductor die, sacrificial blank, and routing structure are encapsulated with an encapsulant. The carrier substrate is separated from a first side of the encapsulated semiconductor die, sacrificial blank, and routing structure to expose a surface of the sacrificial blank. The sacrificial blank is etched to form a cavity in the encapsulant and expose a portion of the routing structure exposed through the cavity.

13 Claims, 18 Drawing Sheets

(51) Int. Cl.
*H01L 23/31* (2006.01)
*H01L 23/538* (2006.01)
*H01L 25/00* (2006.01)
*H01L 25/16* (2023.01)
*H01L 21/48* (2006.01)

(52) U.S. Cl.
CPC .......... *H01L 23/5386* (2013.01); *H01L 24/20* (2013.01); *H01L 25/16* (2013.01); *H01L 25/50* (2013.01); *H01L 21/4853* (2013.01); *H01L 24/08* (2013.01); *H01L 24/16* (2013.01); *H01L 24/32* (2013.01); *H01L 24/48* (2013.01); *H01L 2224/08225* (2013.01); *H01L 2224/16227* (2013.01); *H01L 2224/19* (2013.01); *H01L 2224/211* (2013.01); *H01L 2224/32227* (2013.01); *H01L 2224/48227* (2013.01)

(58) Field of Classification Search
CPC . H01L 2224/32227; H01L 2224/48227; H01L 2224/24151
USPC .......................................................... 438/106
See application file for complete search history.

(56) References Cited

U.S. PATENT DOCUMENTS

| | | |
|---|---|---|
| 8,749,002 B2 | 6/2014 | Fu et al. |
| 9,331,029 B2 | 5/2016 | Vincent et al. |
| 9,799,636 B2 | 10/2017 | Vincent et al. |
| 9,806,061 B2 | 10/2017 | Shen |
| 10,103,447 B2 | 10/2018 | Tong et al. |
| 10,199,302 B1 | 2/2019 | Sanchez et al. |
| 11,031,681 B2 | 6/2021 | Vincent et al. |
| 2013/0099381 A1 | 4/2013 | Akiyama et al. |
| 2015/0001708 A1* | 1/2015 | Lin ................ H01L 25/50 257/737 |
| 2019/0051571 A1 | 2/2019 | Sanchez et al. |
| 2020/0003975 A1* | 1/2020 | Yu ................ G02B 6/4243 |

OTHER PUBLICATIONS

U.S. Appl. No. 17/643,198, filed Dec. 8, 2021, and entitled "Semiconductor Device With Open Cavity and Method Therefor".
U.S. Appl. No. 18/910,373, filed Oct. 9, 2024, and entitled "Semiconductor Device With Open Cavity and Method Therefor".
Notice of Allowance dated Jul. 18, 2024 in U.S. Appl. No. 17/643,198.
Non-final office action dated Nov. 27, 2023 in U.S. Appl. No. 17/643,198.

* cited by examiner

SEMICONDUCTOR DEVICE WITH OPEN CAVITY AND METHOD THEREFOR

BACKGROUND

Field

This disclosure relates generally to semiconductor device packaging, and more specifically, to semiconductor devices with an open cavity and method of forming the same.

Related Art

Today, there is an increasing trend to include sophisticated semiconductor devices in products and systems that are used every day. These sophisticated semiconductor devices may include features for specific applications which may impact the configuration of the semiconductor device packages, for example. For some features and applications, the configuration of the semiconductor device packages may be susceptible to lower reliability, lower performance, and higher product or system costs. Accordingly, significant challenges exist in accommodating these features and applications while minimizing the impact on semiconductor devices' reliability, performance, and costs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device with an open cavity. The semiconductor device includes a semiconductor die and a sacrificial blank with an attached routing structure at least partially encapsulated with an encapsulant. After encapsulation, a surface of the sacrificial blank is exposed. The exposed surface of the sacrificial blank is etched to form the cavity in the encapsulant. A top surface of the routing structure including conductive feeds is exposed when the cavity is formed. The exposed feeds may be configured for attachment of an external component such as a second semiconductor die, a sensor, an active element, a passive element, a connector, and the like. The semiconductor die may be interconnected with one or more of the feeds by way of a package substrate. The package substrate may be formed as a build-up substrate or may be provided as a pre-formed substrate. By forming the semiconductor device with the open cavity in this manner, integration with an external component may overall have improved reliability, better performance, and lower costs.

Figure 1:
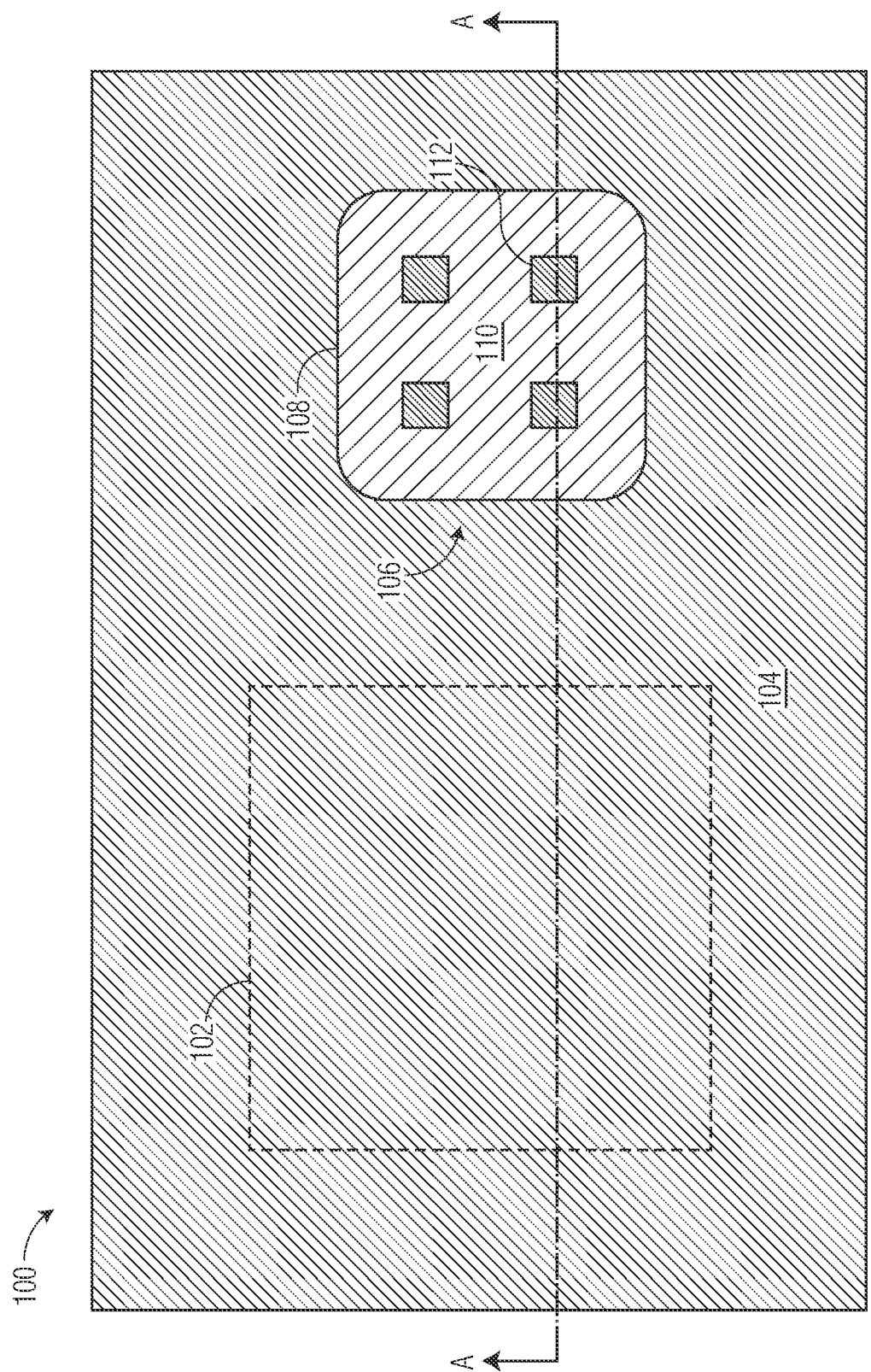
FIG. 1 illustrates, in a simplified top-side-up plan view, an example semiconductor device having an open cavity at a stage of manufacture in accordance with an embodiment.

FIG. 1 illustrates, in a simplified top-side-up plan view, an example semiconductor device 100 having an open cavity at a stage of manufacture in accordance with an embodiment. In this embodiment, the semiconductor device 100 includes a semiconductor die 102 (shown as dashed outline for reference) and a routing structure 106 encapsulated with an encapsulant 104 (e.g., epoxy molding compound). A top portion of the routing structure 106 is exposed through a cavity 108 formed in the encapsulant by way of a subtractive process. The routing structure 106 includes a non-conductive substrate 110 and a plurality of conductive feeds 112. The term "conductive," as used herein, generally refers to electrical conductivity unless otherwise specified. The size and shape of the cavity 108 along with the number and arrangement of the conductive feeds 112 in this embodiment are chosen for illustration purposes. In some embodiments, the cavity 108 may be formed in any suitable shape and size and the routing structure 106 may include any number of conductive feeds 112, arranged accordingly. For example, the conductive feeds 112 may be arranged in the form of one or more antennas or signal launchers configured for propagation of radio frequency signals in some embodiments. Simplified cross-sectional views of the example semiconductor device 100 taken along line A-A at stages of manufacture are depicted in FIG. 2 through FIG. 9.

Figure 2:
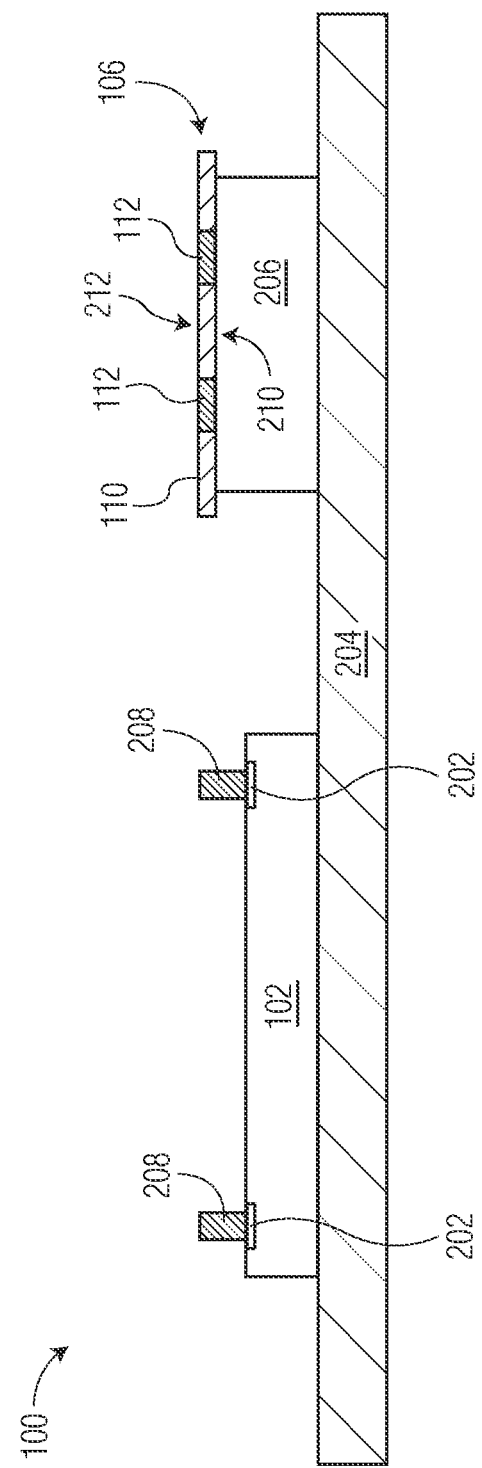
FIG. 2 through FIG. 9 illustrate, in simplified cross-sectional views, the example semiconductor device at stages of manufacture in accordance with an embodiment.

FIG. 2 illustrates, in a simplified cross-sectional view, the example semiconductor device 100 taken along line A-A at a stage of manufacture in accordance with an embodiment. At this stage, the semiconductor device 100 includes the semiconductor die 102 and sacrificial blank 206 with attached routing structure 106 placed on a carrier substrate 204. The carrier substrate 204 is configured and arranged to provide a temporary structure for placement of the semiconductor die 102 and the sacrificial blank 206 with attached routing structure 106 during encapsulation at a subsequent stage of manufacture, for example. In this embodiment, the routing structure 106 is configured for attachment of an external component such as a second semiconductor die, an active element (e.g., transistor, diode), a passive element (e.g., resistor, capacitor, inductor), a connector, and the like.

The semiconductor die 102 has an active side (e.g., major side having circuitry) and a backside (e.g., major side opposite of the active side). The semiconductor die 102 includes bond pads 202 formed at the active side. At least one of the bond pads 202 is configured for connection to at least one of the feeds 112 of the routing structure 106 by way of a package substrate formed at a subsequent stage, for example. In this embodiment, semiconductor die 102 is configured in an active-side-up orientation with the backside placed on the carrier substrate 204. The semiconductor die 102 may be formed from any suitable semiconductor material, such as silicon, germanium, gallium arsenide, gallium nitride, and the like. The semiconductor die 102 further includes any digital circuits, analog circuits, RF circuits, memory, processor, the like, and combinations thereof at the active side. In this embodiment, conductive die connectors 208 have a first end affixed to respective bond pads 202. The conductive die connectors 208 may be in the form of any suitable conductive structures such as gold studs, copper pillars, solder balls, and the like. Alternatively, the conductive die connectors 208 may be formed or affixed at a subsequent stage of manufacture. For example, after an encapsulation operation, the bond pads 202 may be exposed (e.g., by way of an etch, laser ablation, or other suitable process) to form or affix the conductive die connectors.

The routing structure 106 has a top side 210 (e.g., major side configured for attachment of an external component) and a backside 212 (e.g., major side opposite of the top side). The routing structure 106 includes the non-conductive substrate 110 and conductive feeds 112. Each of the conductive feeds 112 provide a conductive interconnect between the top side 210 and the backside 212 of the routing structure 106. Each of the conductive feeds 112 at the top side 210 of the routing structure 106 are formed having size and shapes suitable for attachment of a desired external component. Alternatively, the conductive feeds 112 may be arranged in the form of one or more antennas or signal launchers configured for propagation of radio frequency signals. In this embodiment, the top side 210 of the routing structure 106 is affixed on a first surface of the sacrificial blank 206.

The routing structure 106 may be formed as a build-up substrate directly on the first surface of the sacrificial blank 206 or may be provided as a pre-formed substrate otherwise applied on the first surface of the sacrificial blank 206. The substrate 110 of the routing structure 106 may be formed from suitable non-conductive materials such as a laminate (e.g., Bismaleimide Triazine, FR4), ABF, prepreg, and the like. The feeds 112 of the routing structure 106 may be formed from one or more suitable conductive materials (e.g., metal).

The sacrificial blank 206 may be formed from suitable materials such as non-crystalline glass, ceramic, quartz, plastic, polymer, and the like. The material composition of the sacrificial blank 206 is selected such that the sacrificial blank material may be etched by an etchant without etching or otherwise attacking an encapsulant, for example. The composition of the sacrificial blank 206 may be further chosen based on a desired coefficient of thermal expansion (CTE) property. For example, it may be desirable to choose a sacrificial blank 206 with a CTE property substantially similar to a CTE property of the encapsulant 104 to minimize package warpage. The sacrificial blank 206 may be formed in any desired shape and sidewall profile to form a desired cavity at a subsequent stage of manufacture. Accordingly, a predetermined portion of the top side 210 of the routing structure 106 may be exposed through the cavity.

Figure 3:
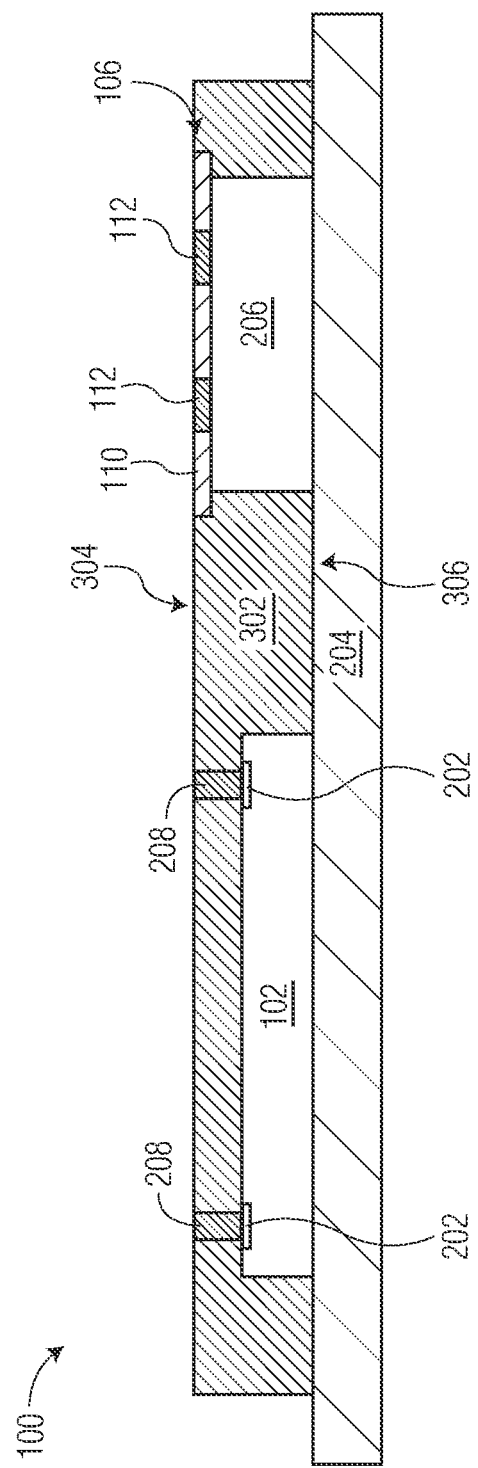

FIG. 3 illustrates, in a simplified cross-sectional view, the example semiconductor device 100 taken along line A-A at a subsequent stage of manufacture in accordance with an embodiment. At this stage, the semiconductor device 100 includes the semiconductor die 102 and sacrificial blank 206 with attached routing structure 106 at least partially encapsulated with an encapsulant 302 while temporarily affixed on the carrier substrate 204. For illustration purposes, the encapsulated semiconductor device 100 has a first major side 304 and a second major side 306 (opposite of the first major side 304) formed on the carrier substrate 204. The encapsulant 302, as depicted in this cross-sectional view, corresponds to the encapsulant 104 depicted in the plan view of FIG. 1.

In this embodiment, the semiconductor die 102 and sacrificial blank 206 with attached routing structure 106 are over-molded with the encapsulant 302 by way of a molding process. The encapsulated semiconductor device 100 is then subjected to a back grind operation to expose portions of the conductive feeds 112 and the conductive die connectors 208 at the first major side 304 of the encapsulant 302. Alternatively, the semiconductor die 102 and sacrificial blank 206 with attached routing structure 106 may be molded with the encapsulant 302 by way of a film-assisted molding (FAM) process. For example, a FAM tool using a conformal film may be engaged with predetermined portions of the conductive feeds 112 and the conductive die connectors 208 during the molding process to keep the predetermined portions free from encapsulant. In this manner, portions of the conductive feeds 112 and the conductive die connectors 208 may be exposed at the first major side 304 of the encapsulant 302 without a back grind operation.

Figure 4:
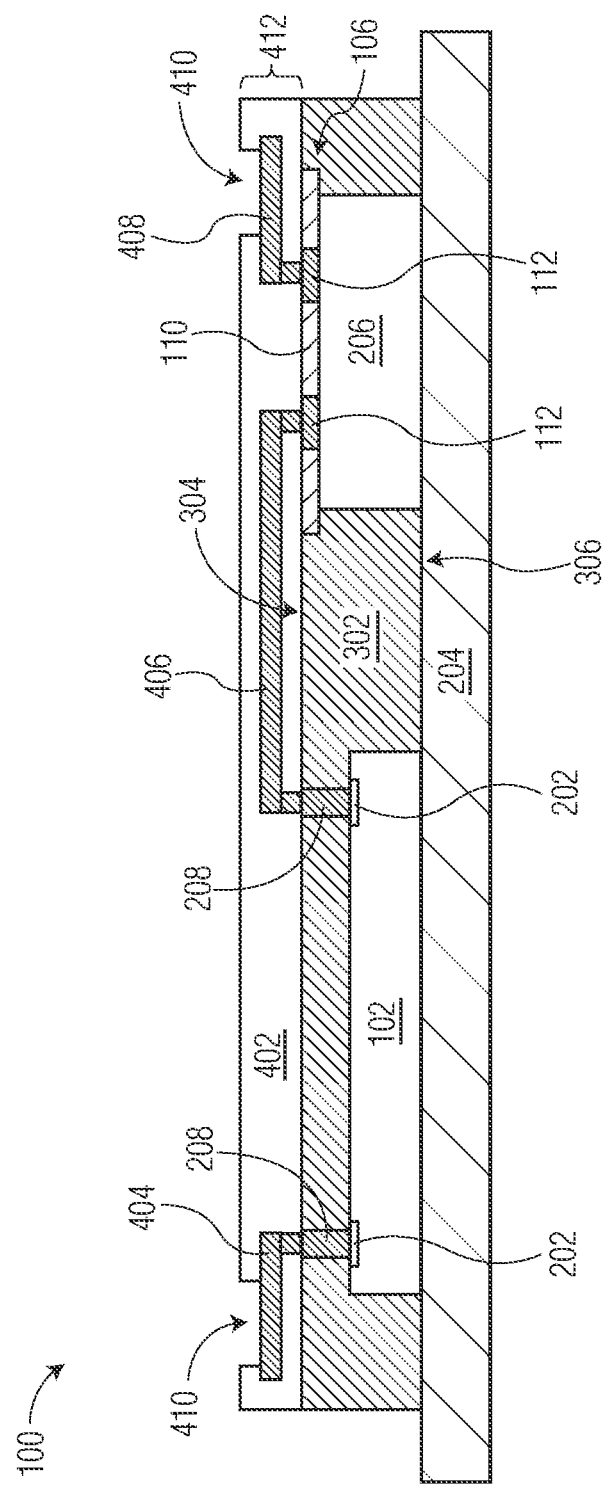

FIG. 4 illustrates, in a simplified bottom-side-up cross-sectional view, the example semiconductor device 100 taken along line A-A at a subsequent stage of manufacture in accordance with an embodiment. At this stage, an interconnecting package substrate 412 is applied to the first major side 304 of the encapsulated semiconductor device 100. After portions of the conductive feeds 112 and the conductive die connectors 208 are exposed at the first major side 304 of the encapsulant 302, the package substrate 412 is applied. The package substrate 412 includes conductive features (e.g., traces 404-408) surrounded by non-conductive material 402 (e.g., dielectric). The package substrate 412 may be formed as a build-up substrate or may be provided as a pre-formed substrate.

Conductive traces 404-408 are formed in the package substrate to interconnect the semiconductor die 102 and the routing structure 106 (e.g., trace 406) and to interconnect the semiconductor die 102 and the routing structure 106 with a printed circuit board (PCB), for example. Openings 410 in the non-conductive material 402 expose portions of traces 404 and 408 configured for attachment of conductive connectors at a subsequent stage of manufacture.

Figure 5:
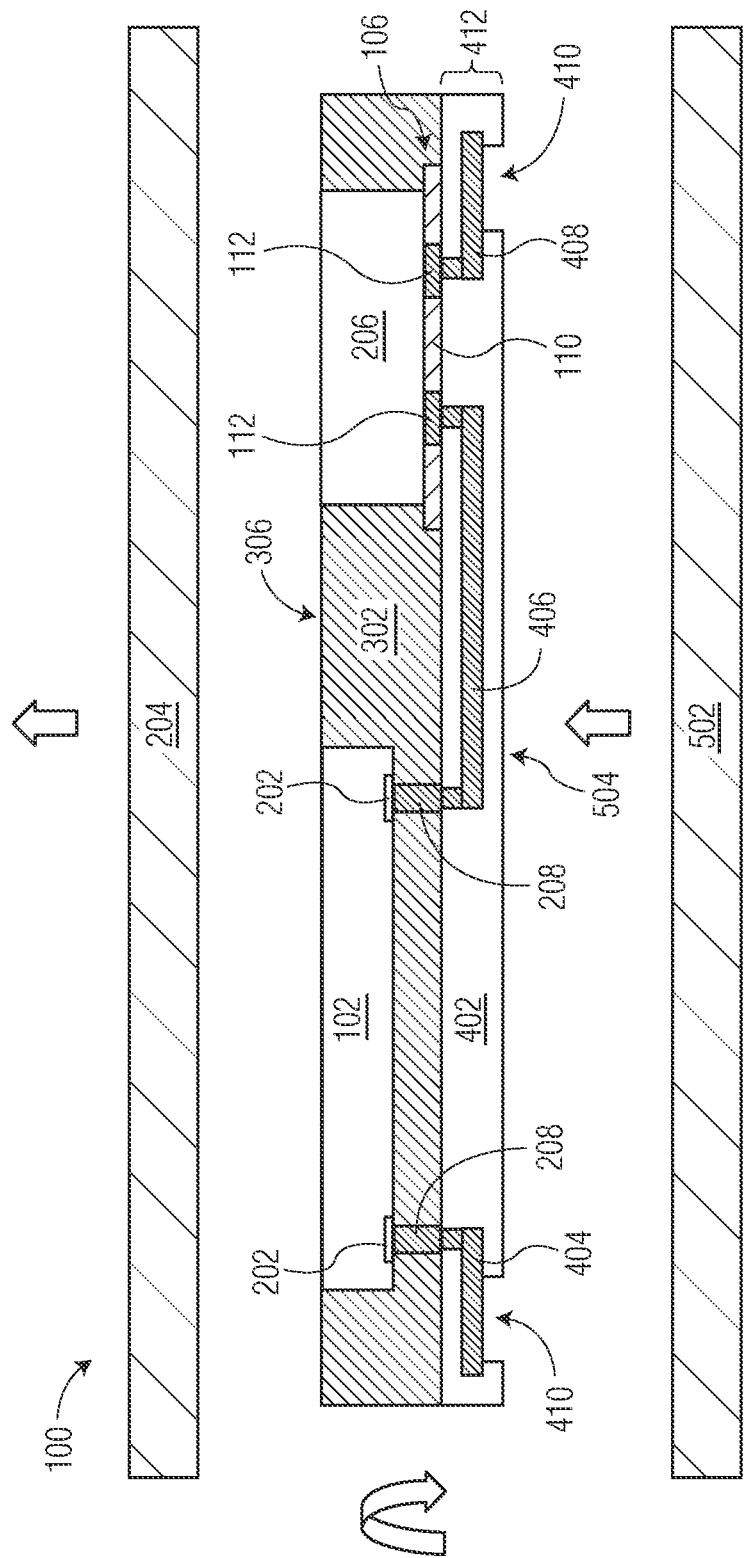

FIG. 5 illustrates, in a simplified cross-sectional view, the example semiconductor device 100 taken along line A-A at a subsequent stage of manufacture in accordance with an embodiment. At this stage, the encapsulated semiconductor device 100 is reoriented (e.g., flipped) and separated from the carrier substrate 204. The backside of the semiconductor die 102 and a second surface (opposite of the first surface) of the sacrificial blank 206 become exposed when the carrier substrate 204 is removed. After the carrier substrate 204 is removed, encapsulated semiconductor device 100 is placed on a second carrier substrate 502. The encapsulated semiconductor device 100 is oriented such that a bottom surface 504 of the package substrate 412 is placed onto the second carrier substrate 502. The carrier substrate 502 is configured and arranged to provide a temporary structure for placement of the encapsulated semiconductor device 100 during operations at a subsequent stage of manufacture, for example. The carrier substrate 502 may be a reused carrier substrate 204.

Figure 6:
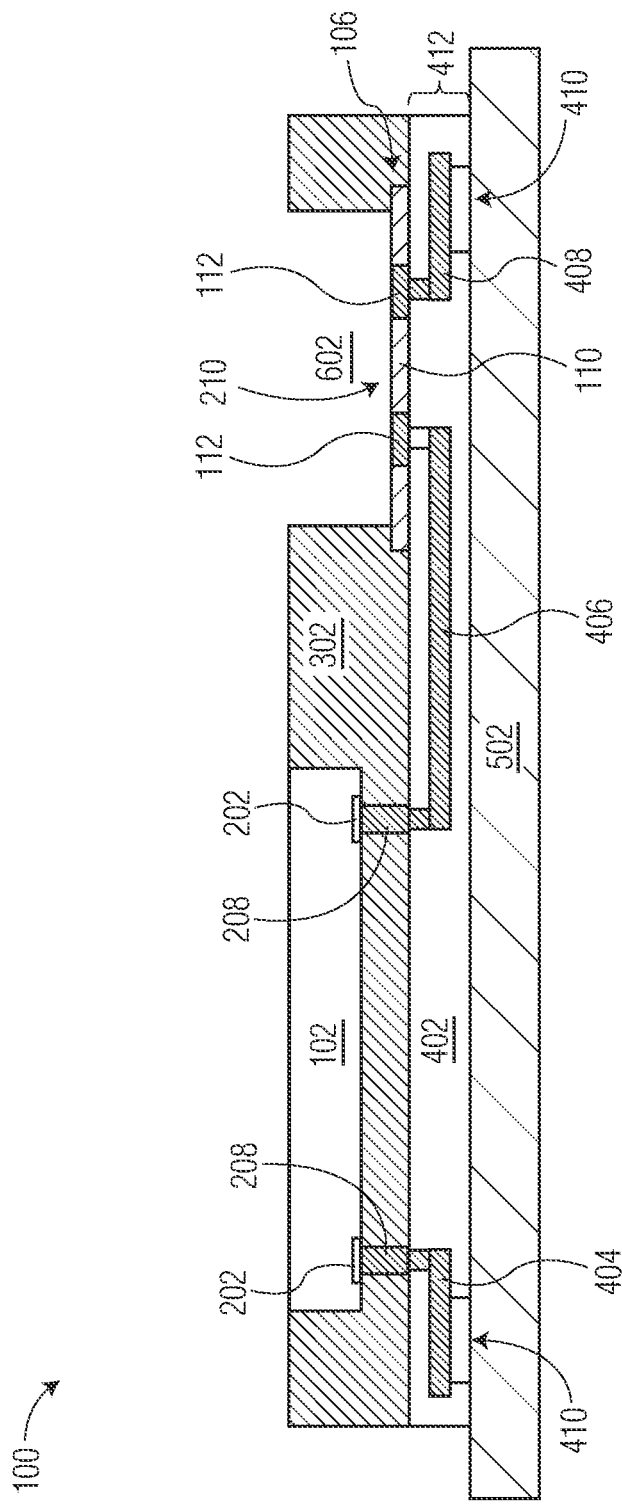

FIG. 6 illustrates, in a simplified cross-sectional view, the example semiconductor device 100 taken along line A-A at a subsequent stage of manufacture in accordance with an embodiment. At this stage, the sacrificial blank (206) is removed by way of an etch process (e.g., chemical etching) to form a cavity 602 in the encapsulant 302. In this embodiment, the composition of the sacrificial blank (206) allows for the sacrificial blank material to be etched by an etchant that does not etch or otherwise attack the encapsulant 302, for example. After the sacrificial blank (206) is removed, a predetermined portion of the top side 210 of the routing structure 106 is exposed through the cavity 602. In particular, the exposed portion of the routing structure 106 includes exposed conductive feeds 112 configured for attachment of an external component. In some embodiments, it may be desirable to apply a metal coating to the sidewalls of the cavity 602 for electromagnetic shielding or waveguide formation (e.g., when the conductive feeds 112 are arranged in the form of one or more antennas or signal launchers). The cavity 602, as depicted in this cross-sectional view, corresponds to the cavity 108 depicted in the plan view of FIG. 1.

Figure 7:
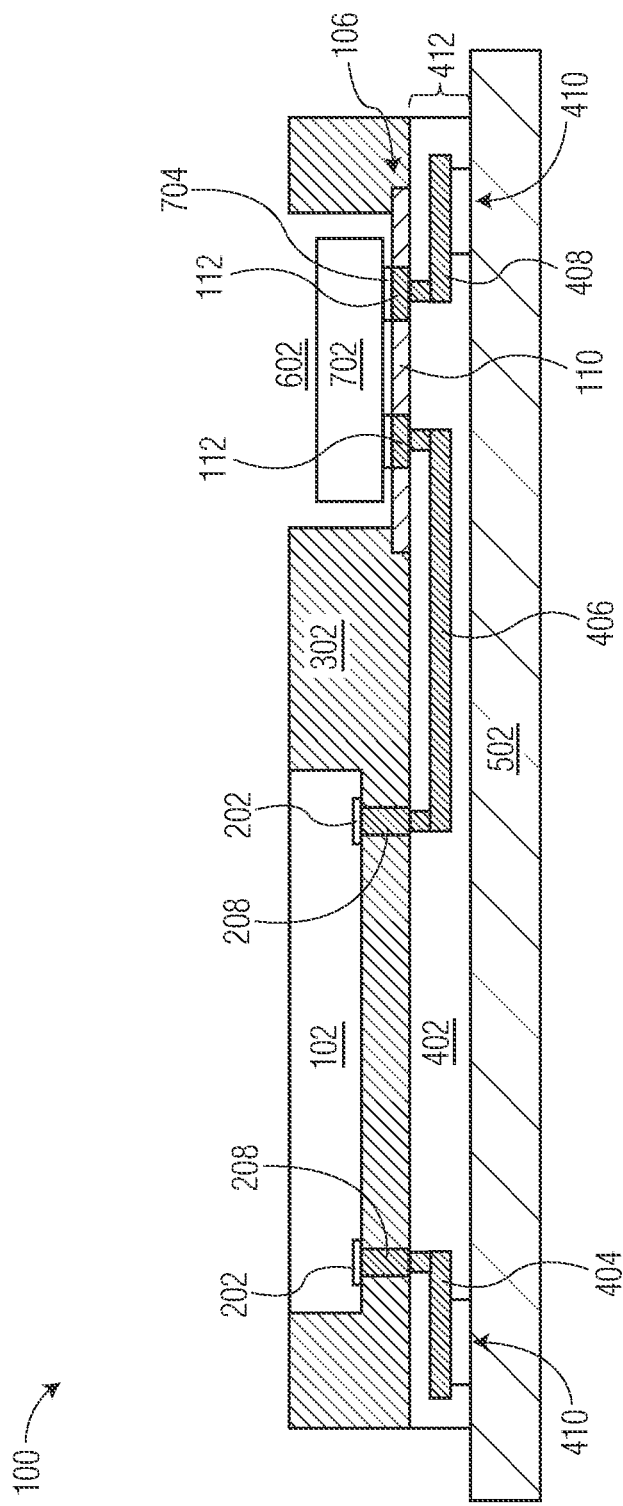

FIG. 7 illustrates, in a simplified cross-sectional view, the example semiconductor device 100 taken along line A-A at a subsequent stage of manufacture in accordance with an embodiment. At this stage, an external component 702 is attached to the routing structure 106. In this embodiment, the external component 702 includes connection pads (not shown) which are affixed to feeds 112 by way of a conductive interface material 704 (e.g., solder, solder paste, conductive adhesive). The external component 702 as depicted in FIG. 7 is chosen for illustration purposes. The external component 702 may be any of a semiconductor die, an active element (e.g., transistor, diode), a passive element (e.g., resistor, capacitor, inductor), a connector (single, multiple, coaxial) and the like. In some embodiments, an external accessory (e.g., speaker, microphone, remote device) may be connected to the semiconductor device 100 by way of the external component 702 in the form of a connector.

Figure 8:
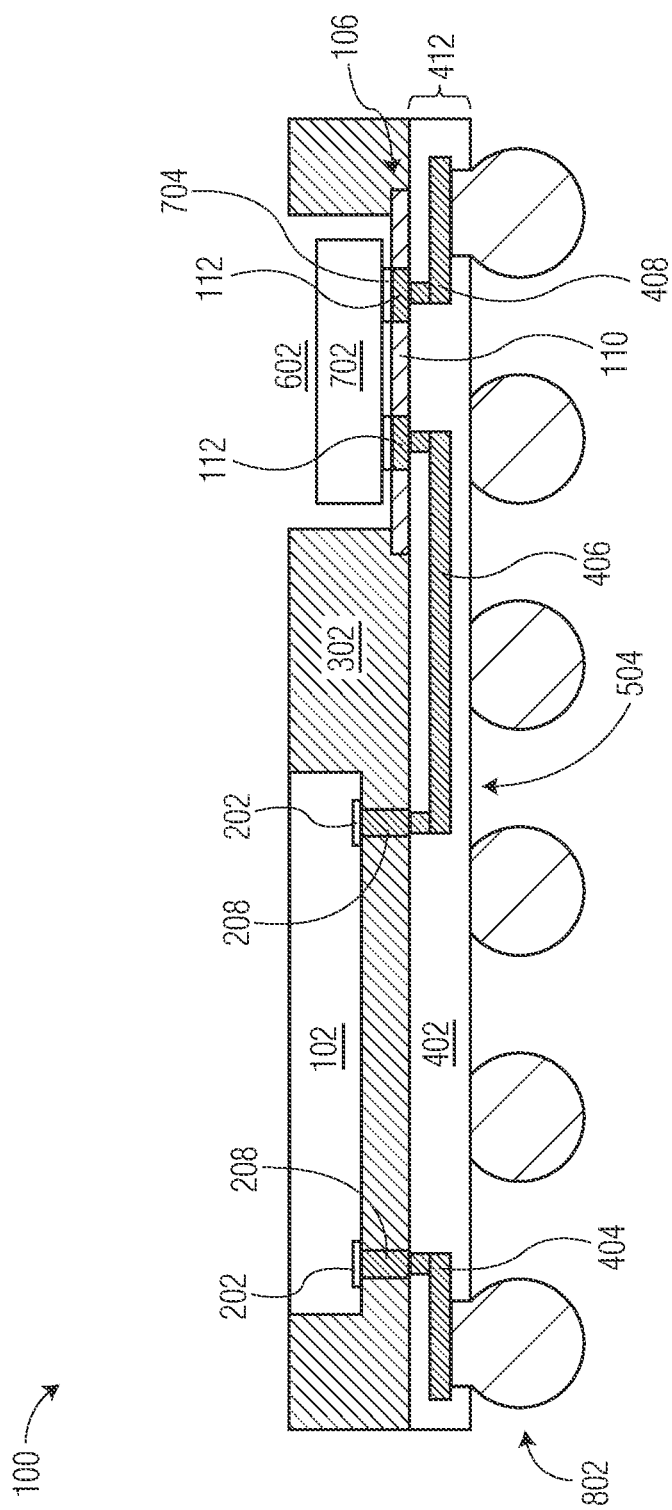

FIG. 8 illustrates, in a simplified cross-sectional view, the example semiconductor device 100 taken along line A-A at a subsequent stage of manufacture in accordance with an embodiment. At this stage, after attaching the external component 702 to the routing structure 106, conductive connectors 802 (e.g., solder balls) are affixed to a bottom surface 504 of the package substrate 612. The conductive connectors 802 are configured and arranged to provide conductive connections between the semiconductor device 100 and a PCB, for example. The conductive connectors 802 may be in the form of any suitable conductive structures such as solder balls, gold studs, copper pillars, and the like, to connect conductive features of the semiconductor device 100 with the PCB. As an alternative to conductive connectors 802, the exposed portions of conductive traces 404 and 408 may be plated for subsequent connection with the PCB by way of solder paste attachment or other suitable conductive attachment processes (e.g., ACF, ACP).

Figure 9:
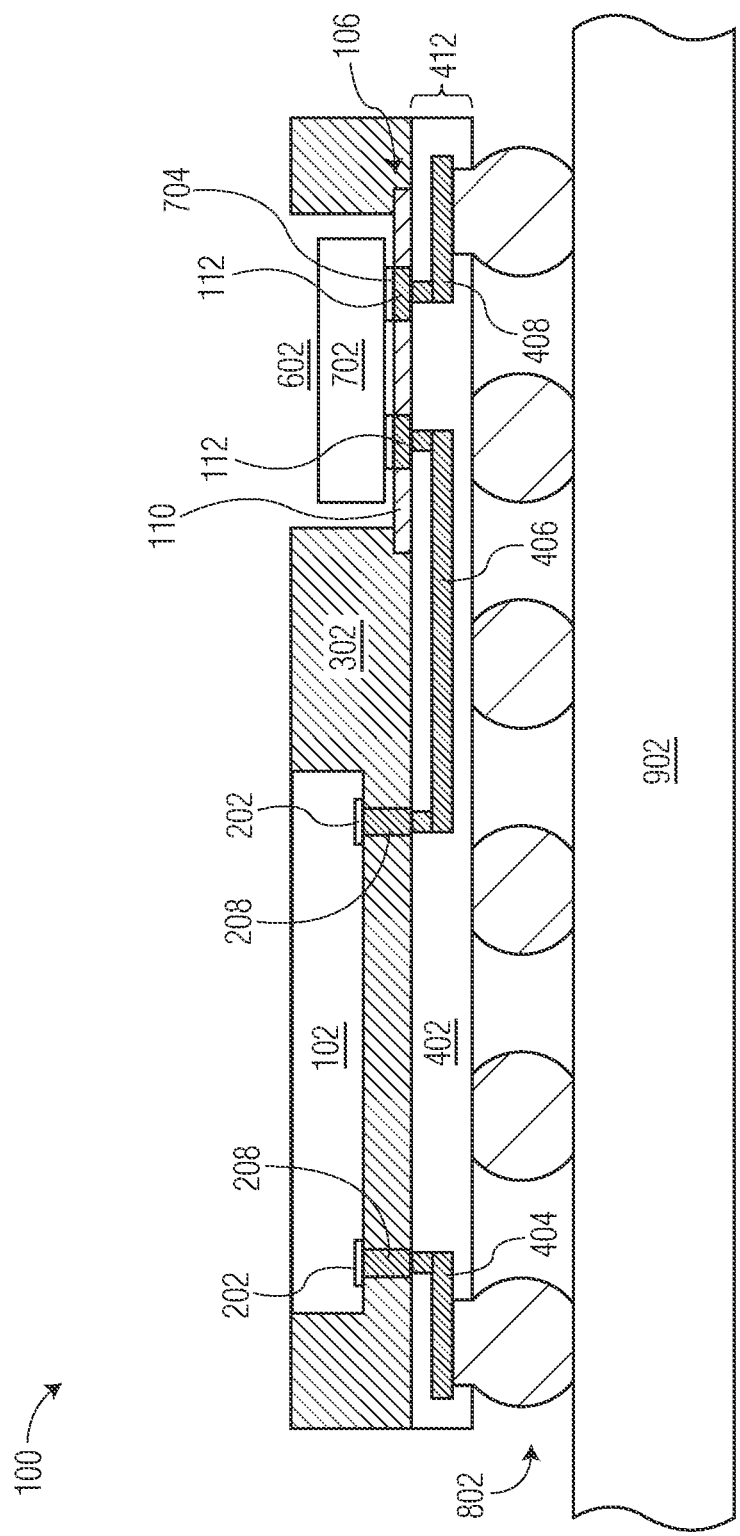

FIG. 9 illustrates, in a simplified cross-sectional view, the example semiconductor device 100 taken along line A-A at a subsequent stage of manufacture in accordance with an embodiment. At this stage, the semiconductor device 100 is attached to an example PCB 902. The conductive connectors 802 attached at the bottom of the package substrate 412 are affixed to the PCB using known techniques and materials. Conductive (e.g., metal) features of the PCB are not shown for illustrative purposes.

Figure 10:
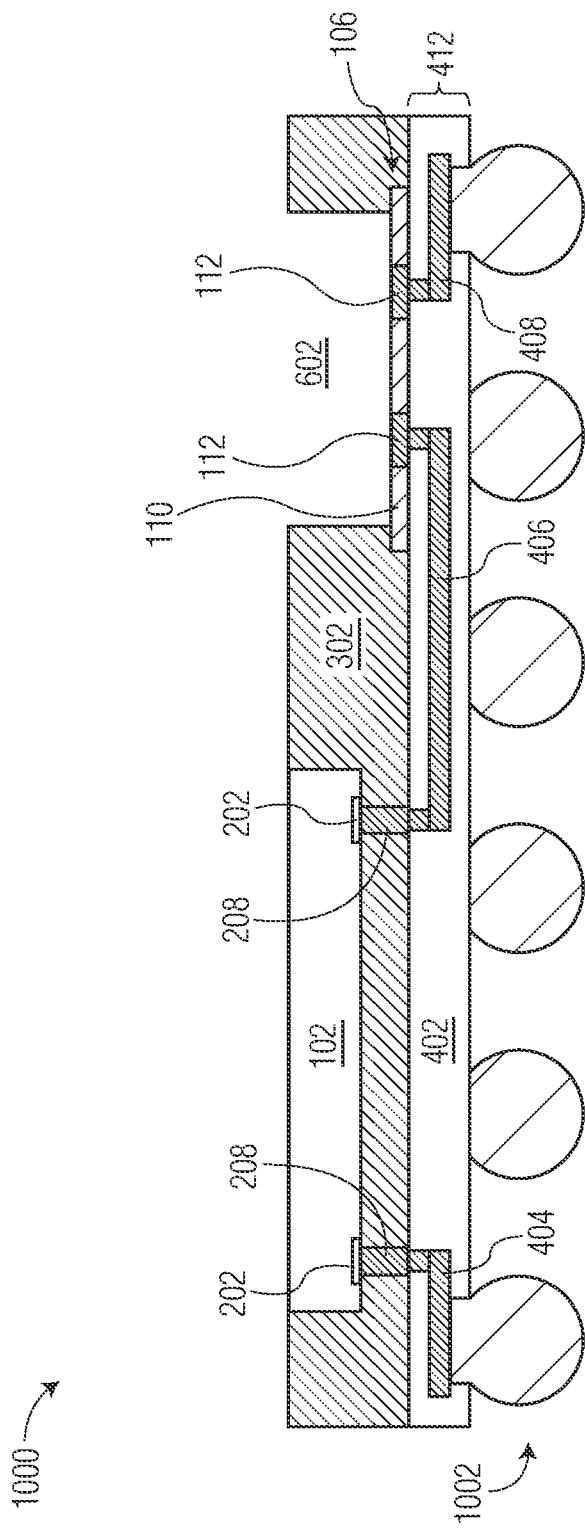
FIG. 10 through FIG. 12 illustrate, in simplified cross-sectional views, the example semiconductor device at alternative stages of manufacture in accordance with an embodiment.
Figure 11:
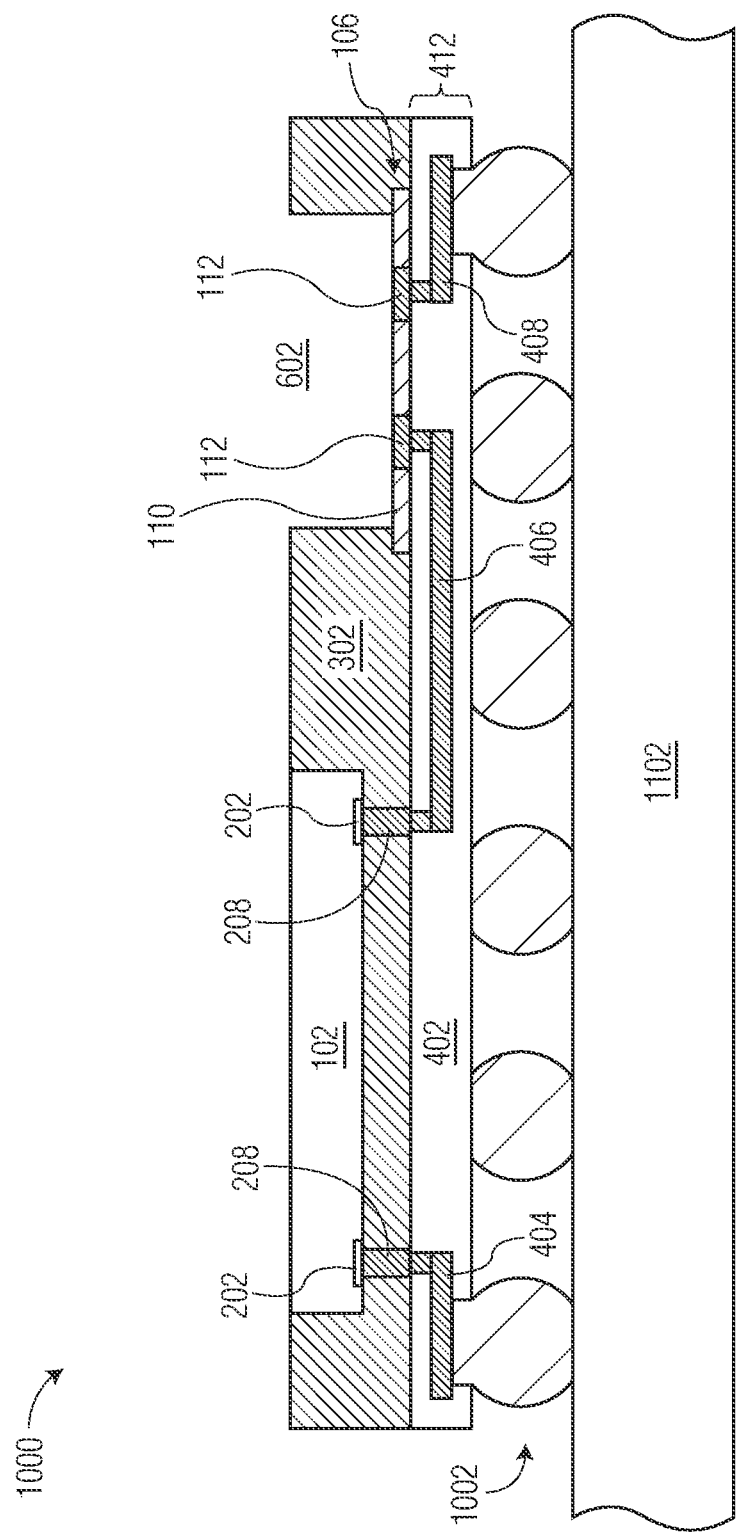
Figure 12:
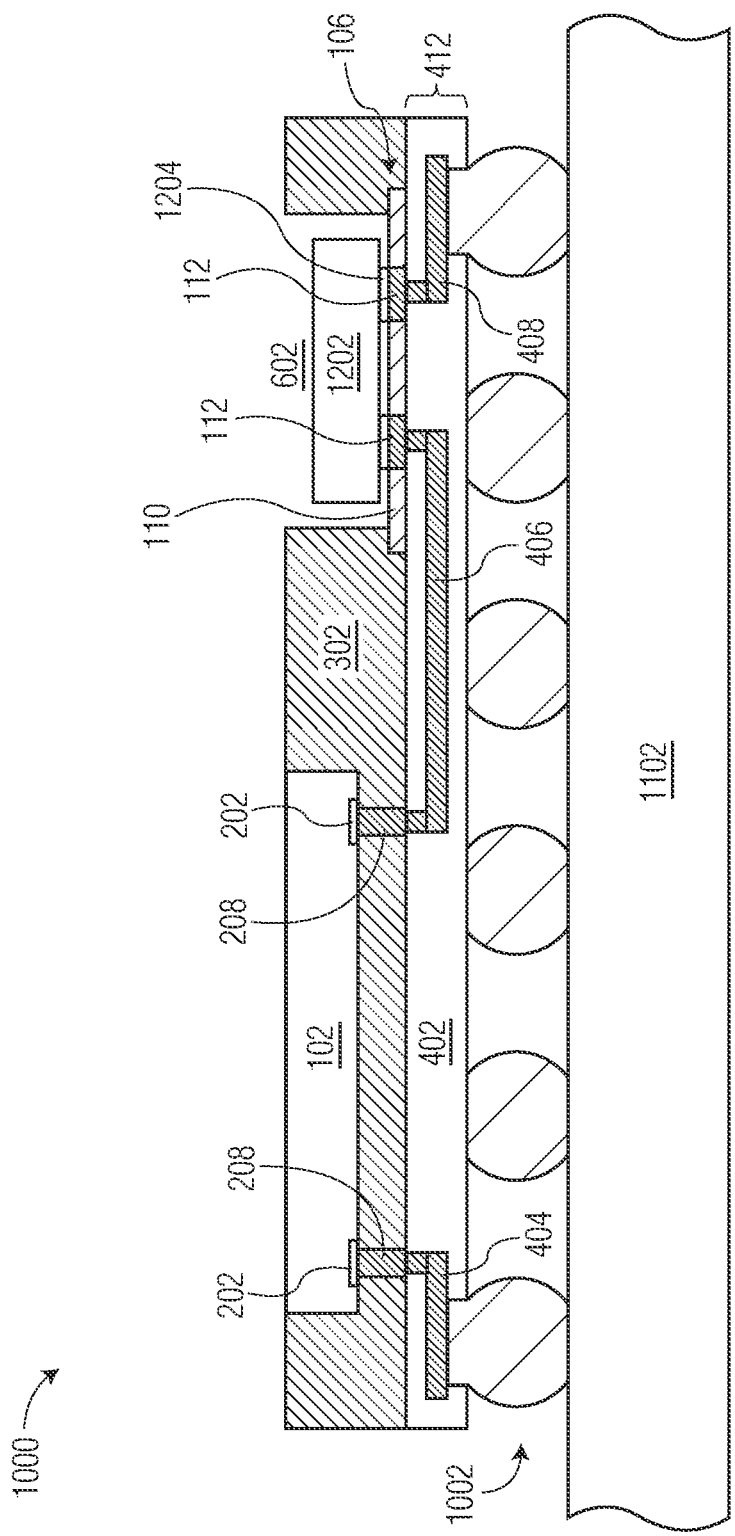

FIG. 10 through FIG. 12 illustrate, in simplified cross-sectional views, an example semiconductor device 1000 at alternative stages of manufacture in accordance with an embodiment. The stages of manufacture depicted in FIG. 10 through FIG. 12 are an alternative to the stages of manufacture for the example semiconductor device 100 depicted in FIG. 7 through FIG. 9, with stages of manufacture depicted in FIG. 2 through FIG. 6 remaining substantially the same.

FIG. 10 illustrates, in a simplified cross-sectional view, the example semiconductor device 1000 at an alternative stage of manufacture in accordance with an embodiment. The stage of manufacture depicted in FIG. 10 is an alternative stage subsequent to the stage of manufacture depicted in FIG. 7, for example. At this stage, conductive connectors 1002 (e.g., solder balls) are affixed to a bottom surface of the package substrate 412 of the semiconductor device 1000. The conductive connectors 1002 are configured and arranged to provide conductive connections between the semiconductor device 1000 and a PCB, for example. The conductive connectors 1002 may be in the form of any suitable conductive structures such as solder balls, gold studs, copper pillars, and the like, to connect conductive features of the semiconductor device 1000 with the PCB.

FIG. 11 illustrates, in a simplified cross-sectional view, the example semiconductor device 1000 at a subsequent stage of manufacture in accordance with an embodiment. At this stage, the semiconductor device 1000 is attached to an example PCB 1102. The conductive connectors 1002 attached at the bottom of the package substrate 412 are affixed to the PCB using known techniques and materials. Conductive (e.g., metal) features of the PCB are not shown for illustrative purposes.

FIG. 12 illustrates, in a simplified cross-sectional view, the example semiconductor device 1000 at a subsequent stage of manufacture in accordance with an embodiment. At this stage, an external component 1202 is attached to the routing structure 106. In this embodiment, the external component 1202 includes connection pads (not shown) which are affixed to feeds 112 by way of a conductive interface material 1204 (e.g., solder, solder paste, conductive adhesive). The external component 1202 as depicted in FIG. 12 is chosen for illustration purposes. The external component 1202 may be any of a semiconductor die, an active element (e.g., transistor, diode), a passive element (e.g., resistor, capacitor, inductor), a connector (single, multiple, coaxial) and the like. In some embodiments, an external accessory (e.g., speaker, microphone, remote device) may be connected to the semiconductor device 1000 by way of the external component 1202 in the form of a connector.

FIG. 13 through FIG. 16 illustrate, in simplified cross-sectional views, example external components affixed on the example semiconductor device 100 in accordance with embodiments. Each of the cross-sectional views depicted in FIG. 13 through FIG. 16 include a focused perspective of the cavity 602 and routing structure 106 portion of the semiconductor device 100 with an example external component attached.

Figure 13:
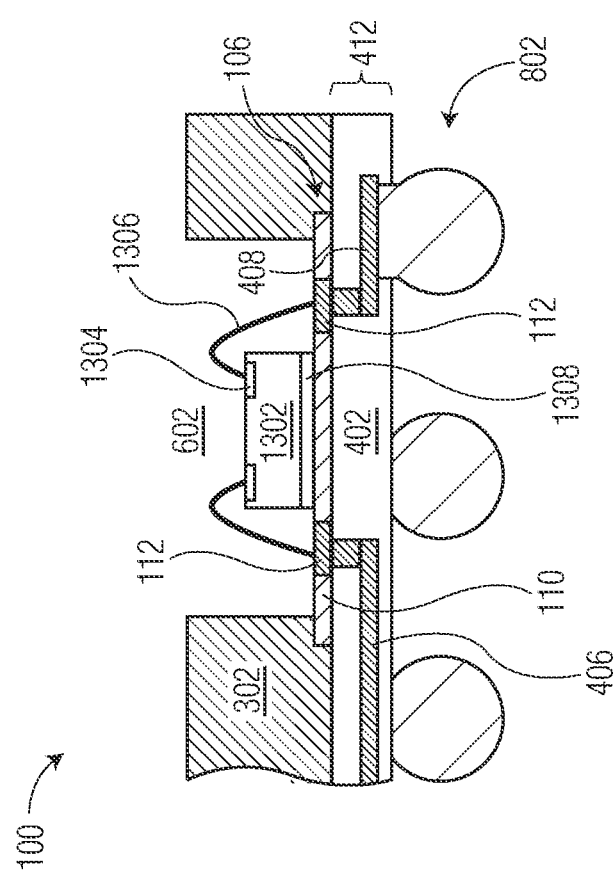
FIG. 13 through FIG. 16 illustrate, in simplified cross-sectional views, example external components affixed on the example semiconductor device in accordance with embodiments.

FIG. 13 illustrates, in a simplified cross-sectional view, a focused portion of the example semiconductor device 100 with an example external semiconductor die 1302 attached in accordance with an embodiment. At this stage, the external semiconductor die 1302 is attached to the routing structure 106. In this embodiment, the external semiconductor die 1302 includes bond pads 1304 at an active side connected to respective feeds 112 of the routing structure 106 by way of bond wires 1306. A backside of the external semiconductor die 1302 is attached to a portion of the substrate 110 of the routing structure 106 by way of die attach adhesive material 1308. In this embodiment, at least one of the bond pads 1304 is interconnected to the encapsulated semiconductor die 102 by way of the trace 406 of the package substrate 412. Alternatively, in some embodiments, the bond pads 1304 may be interconnected to other devices or structures by way of the routing structure 106 and/or may be interconnected directly with a PCB by way of the package substrate 412. The external semiconductor die 1302 may be formed from any suitable semiconductor material, such as silicon, germanium, gallium arsenide, gallium nitride, and the like. The semiconductor die 1302 may further include any digital circuits, analog circuits, RF circuits, MEMS, sensors, memory, processor, the like, and combinations thereof. In some embodiments, a coating or fill (e.g., gel, epoxy) may be applied over the external semiconductor die 1302 and bond wires 1306 for environmental protection. In some embodiments, a lid or window may be attached covering the cavity 602 for environmental protection. Such lid or window may be vented and may be desirable when semiconductor die 1302 includes a pressure sensor, for example.

Figure 14:
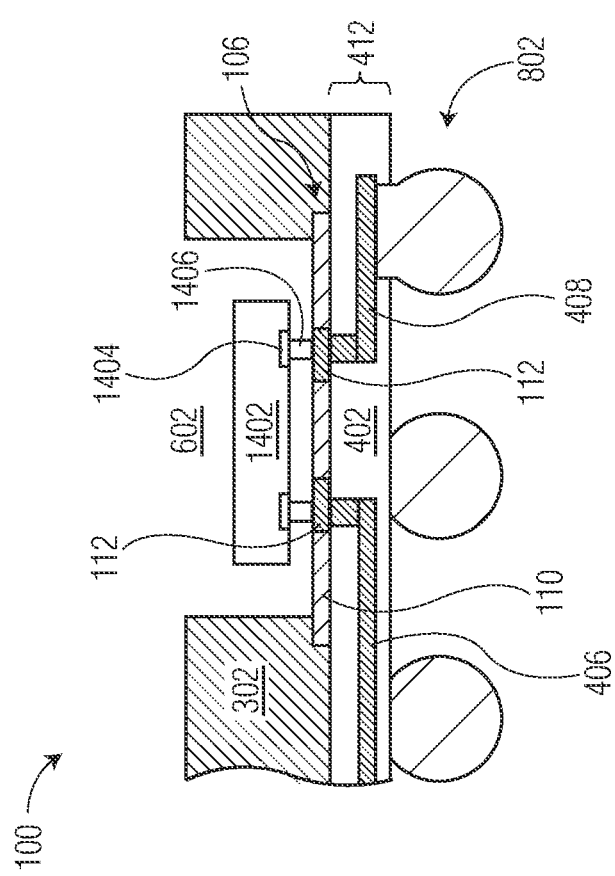

FIG. 14 illustrates, in a simplified cross-sectional view, a focused portion of the example semiconductor device 100 with another example external semiconductor die 1402 attached in accordance with an embodiment. At this stage, the external semiconductor die 1402 is attached to the routing structure 106. In this embodiment, the external semiconductor die 1402 is in an active-side-down orientation and includes bond pads 1404 at the active side connected to respective feeds 112 of the routing structure 106 by way of conductive die connectors (e.g., copper pillars, nanotubes, solder bumps) 1406. In this embodiment, at least one of the bond pads 1404 is interconnected to the encapsulated semiconductor die 102 by way of the trace 406 of the package substrate 412. Alternatively, in some embodiments, the bond pads 1404 may be interconnected to other devices or structures by way of the routing structure 106 and/or may be interconnected directly with a PCB by way of the package substrate 412. The external semiconductor die 1402 may be formed from any suitable semiconductor material, such as silicon, germanium, gallium arsenide, gallium nitride, and the like. The semiconductor die 1402 may further include any digital circuits, analog circuits, RF circuits, MEMS, sensors, memory, processor, the like, and combinations thereof. In some embodiments, a coating or fill (e.g., gel, epoxy) may be applied over the external semiconductor die 1402 for environmental protection. In some embodiments, a lid or window may be attached covering the cavity 602 for environmental protection. Such lid or window may be vented and may be desirable when semiconductor die 1402 includes a pressure sensor, for example.

Figure 15:
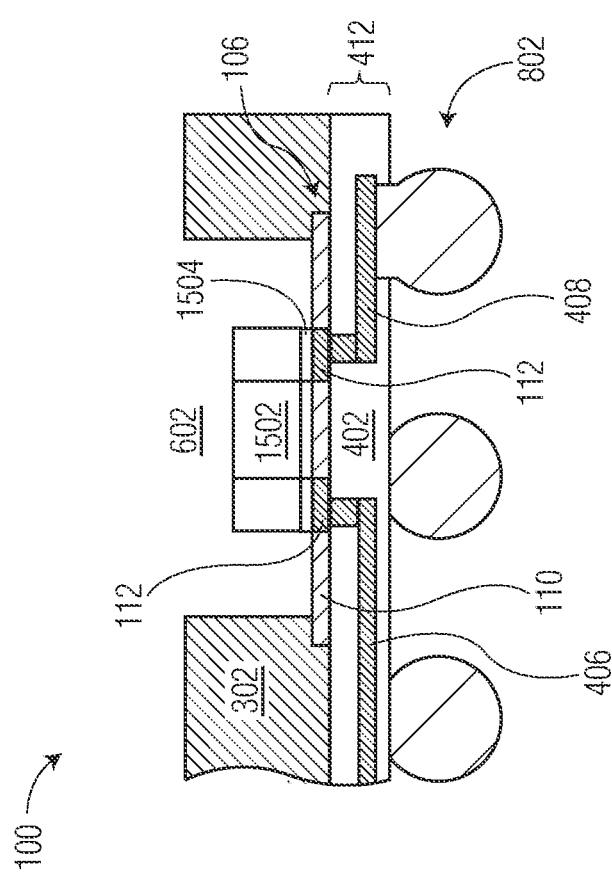

FIG. 15 illustrates, in a simplified cross-sectional view, a focused portion of the example semiconductor device 100 with an external circuit element 1502 attached in accordance with an embodiment. At this stage, the external circuit element 1502 is attached to the routing structure 106. In this embodiment, the external circuit element 1502 includes terminals connected to respective feeds 112 of the routing structure 106 by way of a conductive interface material 1504 (e.g., solder, solder paste, conductive adhesive). In this embodiment, at least one of the terminals of the external circuit element 1502 is interconnected to the encapsulated semiconductor die 102 by way of the trace 406 of the package substrate 412. In this embodiment, the external circuit element 1502 may be formed as a discrete active element (e.g., transistor, diode) or as a discrete passive element (e.g., resistor, capacitor, inductor).

Figure 16:
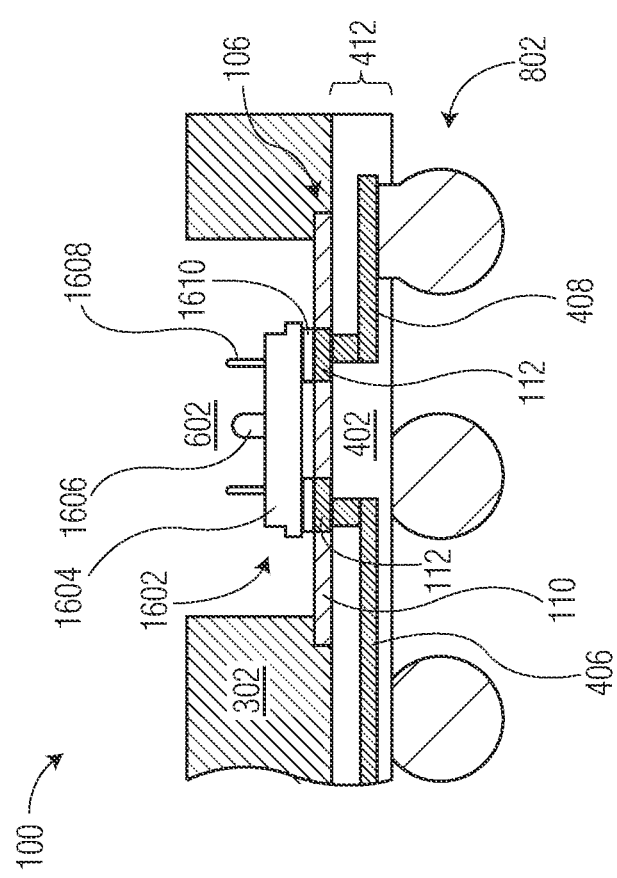

FIG. 16 illustrates, in a simplified cross-sectional view, a focused portion of the example semiconductor device 100 with an external connector 1602 attached in accordance with an embodiment. At this stage, the external connector 1602 is attached to the routing structure 106. In this embodiment, the external connector 1602 includes a base portion 1604 with signal and shield terminals connected to respective feeds 112 of the routing structure 106 by way of a conductive interface material 1610 (e.g., solder, solder paste, conductive adhesive). The external connector 1602 further includes a conductive shield member 1608 attached to the base, and a signal member 1606 electrically isolated from the shield member. In this embodiment, the signal terminal (connected to the signal member 1606) is interconnected to the encapsulated semiconductor die 102 by way of the trace 406 and the shield terminal (connected to the shield member 1608) is interconnected to a ground voltage supply terminal by way of the trace 408. In this embodiment, the external connector 1602 is configured for attachment of mating connector to connect an external accessory (e.g., speaker, microphone, antenna, remote device). In some embodiments, the external connector 1602 may be configured for providing power to an external accessory or for receiving power from an external source. For example, the external connector structure 1602 may be in the form of a plug with the mating connector in the form of a socket, or vice versa.

Figure 17:
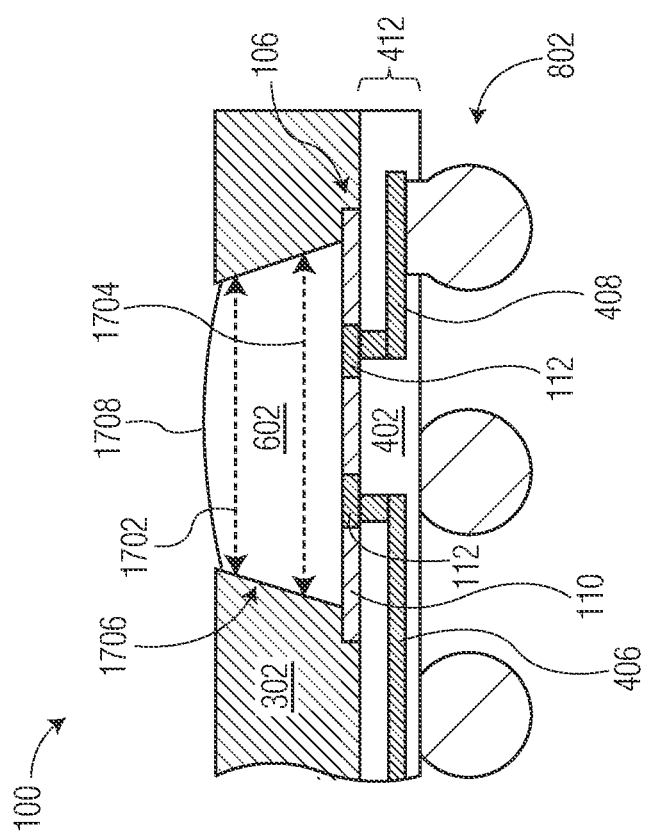
FIG. 17 and FIG. 18 illustrate, in simplified cross-sectional views, example cavity locking features of the example semiconductor device in accordance with embodiments.
Figure 18:
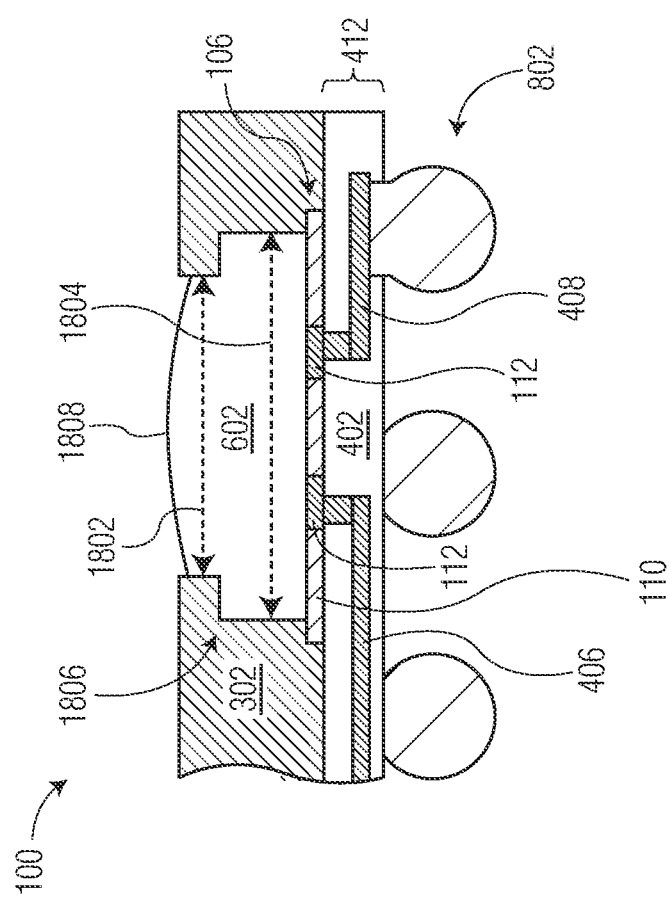

FIG. 17 and FIG. 18 illustrate, in simplified cross-sectional views, example cavity locking features of the example semiconductor device 100 in accordance with embodiments Each of the cross-sectional views depicted in FIG. 17 and FIG. 18 include a focused perspective of the cavity 602 including locking features and routing structure 106 portion of the semiconductor device 100. For illustration purposes, no external components are shown attached in the cavity.

FIG. 17 illustrates, in a simplified cross-sectional view, a focused portion of the example semiconductor device 100 with the cavity 602 including an example locking feature 1706 in accordance with an embodiment. At this stage, the locking feature 1706 of the cavity 602 is formed having angled sidewalls with a first dimension 1702 across the cavity being smaller than a second dimension 1704 across the cavity, and the first dimension 1702 being closer to the top of the cavity 602 than the second dimension 1704. Each of the dimensions 1702 and 1704 (e.g., widths) are substantially parallel to the substrate 110 of the routing structure 106. In this embodiment, the sacrificial blank (206) is provided with angled outer sidewalls such that when etched, form the resulting cavity sidewall profile depicted in FIG. 17. In some embodiments, at a subsequent stage of manufacture, the cavity 602 may be substantially filled with a coating or fill material (e.g., gel, epoxy) 1708 to further protect an external component (not shown) attached in the cavity. Because the locking feature 1706 is formed by way of angled sidewalls as depicted in FIG. 17, the locking feature serves to secure the coating or fill material 1708 within the cavity 602.

FIG. 18 illustrates, in a simplified cross-sectional view, a focused portion of the example semiconductor device 100 with the cavity 602 including an alternative example locking feature 1806 in accordance with an embodiment. At this stage, the locking feature 1806 of the cavity 602 is formed having stepped sidewalls with a first dimension 1802 across an upper step portion of the cavity being smaller than a second dimension 1804 across a lower step portion of the cavity. Each of the dimensions 1802 and 1804 (e.g., widths) are substantially parallel to the substrate 110 of the routing structure 106. In this embodiment, the sacrificial blank (206) is provided with stepped or notched outer sidewalls such that when etched, form the resulting cavity sidewall profile depicted in FIG. 18. In some embodiments, at a subsequent stage of manufacture, the cavity 602 may be substantially filled with a coating or fill material (e.g., gel, epoxy) 1808 to further protect an external component (not shown) attached in the cavity. Because the locking feature 1806 is formed by way of stepped sidewalls as depicted in FIG. 18, the locking feature serves to secure the coating or fill material 1808 within the cavity 602.

In an embodiment, there is provided, a method of manufacturing a semiconductor device including placing a semiconductor die on a carrier substrate; placing a sacrificial blank on the carrier substrate, a routing structure attached to the sacrificial blank; encapsulating with an encapsulant at least a portion of the semiconductor die, sacrificial blank, and routing structure; separating the carrier substrate from a first side of the encapsulated semiconductor die, sacrificial blank, and routing structure to expose a surface of the sacrificial blank; and etching the sacrificial blank to form a cavity in the encapsulant, a portion of the routing structure exposed through the cavity. The routing structure may include a non-conductive substrate and a plurality of conductive feeds. The method may further include back grinding a major side of the encapsulant to expose a portion of conductive die connectors coupled to the semiconductor die and a portion of the plurality of conductive feeds. The method may further include forming a package substrate on the major side, a conductive trace interconnecting at least one of the exposed conductive die connectors and at least one of the exposed conductive feeds, the conductive trace formed at least in part from a conductive layer of the package substrate. The method may further include attaching a component to the exposed portion of the routing structure in the cavity. The component attached to the routing structure may be characterized as one of a second semiconductor die, a passive element, and a connector. The sidewalls of the cavity may be formed having a locking feature, the locking feature including a first dimension across the cavity being smaller than a second dimension across the cavity, the first dimension being closer to the top of the cavity than the second dimension. The sacrificial blank may have a coefficient of thermal expansion (CTE) property substantially similar to that of the encapsulant. The method may further include affixing conductive connectors to a bottom side of the package substrate, the conductive connectors configured and arranged to provide conductive connections between the semiconductor device and a printed circuit board (PCB).

In another embodiment, there is provided, a semiconductor device including a non-conductive substrate; and a plurality of conductive feeds; a semiconductor die having a bond pad interconnected to a conductive feed of the plurality of conductive feeds by way of a conductive trace; an encapsulant encapsulating at least a portion of the routing structure and the semiconductor die; and a cavity formed in the encapsulant, sidewalls of the cavity having a locking feature, a portion of the top side of the routing structure exposed through the cavity. The locking feature of the cavity may include sidewalls formed having a first dimension between opposing sidewalls of the cavity and a second dimension between the opposing sidewalls, the first dimension smaller than the second dimension, and the first dimension closer to the top of the cavity than the second dimension. A backside of the semiconductor die may be at least partially exposed through the encapsulant. The semiconductor device may further include a conductive die connector having a first end connected to the bond pad and a second end connected to the conductive trace. The semiconductor device may further include a package substate formed on a major side of the encapsulant and backside of the routing structure, the conductive trace formed at least in part from a conductive layer of the package substrate. The semiconductor device may further include a component affixed to the exposed top portion of the routing structure, the component characterized as one of a second semiconductor die, a passive element, and a connector.

In yet another embodiment, there is provided, a method of manufacturing a semiconductor device including placing a semiconductor die on a carrier substrate; placing a sacrificial blank on the carrier substrate, a first side of a routing structure attached to the sacrificial blank, the routing structure including a non-conductive substrate and a plurality of conductive feeds; attaching conductive die connectors to respective die pads of the semiconductor die; encapsulating with an encapsulant at least a portion of the semiconductor die, sacrificial blank, and routing structure; separating the carrier substrate from a first side of the encapsulated semiconductor die, sacrificial blank, and routing structure to expose a surface of the sacrificial blank; and etching the sacrificial blank to form a cavity in the encapsulant, a portion of the first side of the routing structure exposed through the cavity. The conductive feeds may be exposed at the first side of the routing structure and configured for attachment of an external component. The method may further include back grinding a second side of the encapsulant to expose a portion of the conductive die connectors and a portion of the plurality of conductive feeds at a second side of the routing structure. The method may further include forming a package substrate on the second side of the encapsulant, a conductive trace interconnecting at least one of the exposed conductive die connectors and at least one of the exposed conductive feeds, the conductive trace formed at least in part from a conductive layer of the package substrate. The method may further include attaching an external component on the exposed first side of the routing structure in the cavity.

By now, it should be appreciated that there has been provided a semiconductor device with an open cavity. The semiconductor device includes a semiconductor die and a sacrificial blank with an attached routing structure at least partially encapsulated with an encapsulant. After encapsulation, a surface of the sacrificial blank is exposed. The exposed surface of the sacrificial blank is etched to form the cavity in the encapsulant. A top surface of the routing structure including conductive feeds is exposed when the cavity is formed. The exposed feeds may be configured for attachment of an external component such as a second semiconductor die, a sensor, an active element, a passive element, a connector, and the like. The semiconductor die may be interconnected with one or more of the feeds by way of a package substrate. The package substrate may be formed as a build-up substrate or may be provided as a pre-formed substrate. By forming the semiconductor device with the open cavity in this manner, integration with an external component may overall have improved reliability, better performance, and lower costs.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of manufacturing a semiconductor device, the method comprising:
   placing a semiconductor die on a carrier substrate;
   placing a sacrificial blank on the carrier substrate, wherein a first side of the sacrificial blank is placed on the carrier substrate, a routing structure is attached to a second side of the sacrificial blank, the routing structure includes a non-conductive substrate and a plurality of conductive feeds, and the first side of the sacrificial blank is opposite the second side of the sacrificial blank;
   encapsulating with an encapsulant at least a portion of the semiconductor die, the sacrificial blank, and the routing structure;
   separating the carrier substrate from the first side of the encapsulated semiconductor die, the sacrificial blank, and the routing structure to expose a surface of the sacrificial blank; and
   etching the sacrificial blank to form a cavity in the encapsulant, wherein a portion of the routing structure is exposed through the cavity.

2. The method of claim 1, further comprising back grinding a major side of the encapsulant to expose a portion of conductive die connectors coupled to the semiconductor die and a portion of the plurality of conductive feeds.

3. The method of claim 2, further comprising forming a package substate on the major side, a conductive trace interconnecting at least one of the exposed conductive die connectors and at least one of the exposed conductive feeds, the conductive trace formed at least in part from a conductive layer of the package substrate.

4. The method of claim 3, wherein the component attached to the routing structure is characterized as one of a second semiconductor die, a passive element, and a connector.

5. The method of claim 1, further comprising attaching a component to the exposed portion of the routing structure in the cavity.

6. The method of claim 1, wherein sidewalls of the cavity are formed having a locking feature, the locking feature including a first dimension across the cavity being smaller than a second dimension across the cavity, the first dimension being closer to the top of the cavity than the second dimension.

7. The method of claim 1, wherein the sacrificial blank has a coefficient of thermal expansion (CTE) property substantially similar to that of the encapsulant.

8. The method of claim 7, further comprising affixing conductive connectors to a bottom side of the package substrate, the conductive connectors configured and arranged to provide conductive connections between the semiconductor device and a printed circuit board (PCB).

9. A method of manufacturing a semiconductor device, the method comprising:
   placing a semiconductor die on a carrier substrate;
   placing a sacrificial blank on the carrier substrate, wherein a first side of the sacrificial blank is disposed on the carrier substrate, a first side of a routing structure is attached to a second side of the sacrificial blank, the first side of the sacrificial blank is disposed opposite the first side of the sacrificial blank, and the routing structure includes a non-conductive substrate and a plurality of conductive feeds;
   attaching conductive die connectors to respective die pads of the semiconductor die;
   encapsulating with an encapsulant at least a portion of the semiconductor die, the sacrificial blank, and the routing structure;
   separating the carrier substrate from the first side of the encapsulated semiconductor die, the sacrificial blank, and the routing structure to expose a surface of the sacrificial blank; and
   etching the sacrificial blank to form a cavity in the encapsulant, wherein a portion of the first side of the routing structure is exposed through the cavity.

10. The method of claim 9, wherein the conductive feeds are exposed at the first side of the routing structure and configured for attachment of an external component.

11. The method of claim 9, further comprising back grinding a second side of the encapsulant to expose a portion of the conductive die connectors and a portion of the plurality of conductive feeds at a second side of the routing structure.

12. The method of claim 11, further comprising forming a package substate on the second side of the encapsulant, a conductive trace interconnecting at least one of the exposed conductive die connectors and at least one of the exposed conductive feeds, the conductive trace formed at least in part from a conductive layer of the package substrate.

13. The method of claim 9, further comprising attaching an external component on the exposed first side of the routing structure in the cavity.

* * * * *